(12) United States Patent
Higuchi et al.

(10) Patent No.: US 7,067,955 B2
(45) Date of Patent: Jun. 27, 2006

(54) METHOD FOR MAKING POTASSIUM NIOBATE THIN FILM, SURFACE ACOUSTIC WAVE ELEMENT, FREQUENCY FILTER, FREQUENCY OSCILLATOR, ELECTRONIC CIRCUIT AND ELECTRONIC APPARATUS

(75) Inventors: Takamitsu Higuchi, Matsumoto (JP); Setsuya Iwashita, Nirasaki (JP); Hiromu Miyazawa, Toyoshina-machi (JP)

(73) Assignee: Seiko Epson Corporation (JP)

( * ) Notice: Subject to any disclaimer, the term of this patent is extended or adjusted under 35 U.S.C. 154(b) by 123 days.

(21) Appl. No.: 10/401,265

(22) Filed: Mar. 27, 2003

(65) Prior Publication Data

US 2004/0000840 A1  Jan. 1, 2004

(30) Foreign Application Priority Data

Mar. 27, 2002  (JP) .............................. 2002-089821

(51) Int. Cl.
*H03H 9/25*  (2006.01)

(52) U.S. Cl. .............................. 310/313 A; 310/313 R; 29/25.35

(58) Field of Classification Search ............ 310/313 A, 310/313 R; 29/25.35; 264/435, 436
See application file for complete search history.

(56) References Cited

U.S. PATENT DOCUMENTS

| 3,924,145 | A | * | 12/1975 | Kansy ..................... 310/313 A |
| 5,034,949 | A | | 7/1991 | Gunter ........................ 372/21 |
| 5,477,807 | A | * | 12/1995 | Yamada et al. ................. 117/2 |
| 5,494,543 | A | * | 2/1996 | Okano et al. .................. 216/33 |
| 5,824,419 | A | | 10/1998 | Kawai et al. ................ 428/432 |
| 6,203,860 | B1 | | 3/2001 | Kawai et al. ................ 427/497 |
| 6,337,531 | B1 | * | 1/2002 | Nakahata et al. ........ 310/313 R |
| 6,437,486 | B1 | * | 8/2002 | Burcsu et al. .............. 310/358 |
| 6,538,359 | B1 | * | 3/2003 | Hiraku et al. ........... 310/313 R |
| 6,619,124 | B1 | * | 9/2003 | Ogiura .................... 73/514.34 |
| 6,677,696 | B1 | * | 1/2004 | Ruile ..................... 310/313 A |
| 6,720,846 | B1 | * | 4/2004 | Iwashita et al. ............ 333/193 |
| 6,995,634 | B1 | * | 2/2006 | Iwashita et al. ............ 333/193 |

FOREIGN PATENT DOCUMENTS

| JP | 2000-278085 | * | 10/2000 |
| JP | 2001-068964 | * | 3/2001 |

* cited by examiner

*Primary Examiner*—Thomas M. Dougherty
(74) *Attorney, Agent, or Firm*—Harness, Dickey & Pierce, P.L.C.

(57) ABSTRACT

A method is provided for forming a potassium niobate thin film in which, in a process of manufacturing a surface acoustic wave element, a conductive thin film included in the surface acoustic wave element is used as an electrode for applying an electric field to the potassium niobate thin film that is to serve as the piezoelectric layer of the surface acoustic wave element to polarize it. A surface acoustic wave element, a frequency filter, a frequency oscillator, an electronic circuit, and an electronic apparatus are also provided.

14 Claims, 7 Drawing Sheets

(a)

(b)

METHOD FOR MAKING POTASSIUM NIOBATE THIN FILM, SURFACE ACOUSTIC WAVE ELEMENT, FREQUENCY FILTER, FREQUENCY OSCILLATOR, ELECTRONIC CIRCUIT AND ELECTRONIC APPARATUS

BACKGROUND OF THE INVENTION

1. Technical Field of the Invention

The present invention relates to a method for making a potassium niobate thin film, and to a surface acoustic wave element, a frequency filter, a frequency oscillator, an electronic circuit, and an electronic apparatus.

2. Description of the Related Art

As communication technology is remarkably developing with a particular emphasis on mobile communications such as cellular phones, demands for surface acoustic wave elements are rapidly growing. The development of surface acoustic wave elements is proceeding toward miniaturization and an increase of efficiency and frequency. Also, in order to put the surface acoustic wave elements into practical use, the elements need to have a higher electromechanical coupling coefficient (hereinafter expressed as $K^2$), stable characteristics with temperature changes, and a higher propagation speed of surface acoustic waves.

For example, when a surface acoustic wave element is used as a high-frequency filter, a high $K^2$ is desired from the viewpoint of achieving a low insertion loss and obtaining a wide pass band. Also, in order to increase the resonance frequency, it is desired to use a material capable of achieving a high sound velocity for the element from the viewpoint of the possibility of interdigital transducer (hereinafter referred to as IDT) designs. In order to stabilize characteristics at working temperatures, the temperature coefficient of the center frequency (hereinafter referred to as TCF) must be small.

A conventional surface acoustic wave element substantially consists of a piezoelectric single crystal having an IDT thereon. Exemplary piezoelectric single crystals include rock crystal, lithium niobate ($LiNbO_3$), and lithium tantalate ($LiTaO_3$). On the other hand, a cut angle leading to a high $K^2$ has recently been found in a potassium niobate (hereinafter referred to as $KNbO_3$) single crystal. According to a report in Electron. Lett. Vol. 33 (1997), pp. 193–194, a 0° Y-cut, an X-propagating $KNbO_3$ single crystal plate has a $K^2$ of 0.53, showing a possibility of much higher $K^2$ than the piezoelectric single crystals used for the conventional surface acoustic wave element.

The characteristics of the surface acoustic wave element using a piezoelectric single crystal substrate, such as $K^2$, TCF, and sound velocity, are proper values the substrate material has, and they are determined by the cut angle and the propagation direction. Although the 0° Y-cut, X-propagating $KNbO_3$ single crystal plate has a high $K^2$, it does not exhibit the zero-temperature characteristics that a 45°–75° rotated Y-cut, X-propagating $KNbO_3$ single crystal plate shows, at room temperature. Also, the propagation speed is lower than that of strontium titanate (hereinafter expressed as $SrTiO_3$) and calcium titanate ($CaTiO_3$), which are perovskite oxides as with $KNbO_3$.

It is therefore difficult to achieve satisfactory characteristics, such as high $K^2$, high sound velocity, and zero-temperature characteristics, by using only $KNbO_3$ single crystal plate as the piezoelectric layer of the surface acoustic wave element. Accordingly, it is expected that each characteristic above will be enhanced by depositing a $KNbO_3$ thin film on a substrate and controlling the thickness of the $KNbO_3$ thin film. Preferably, the $KNbO_3$ thin film is a closely packed, flat epitaxial film oriented in an optimum direction from the viewpoint of achieving a satisfactory $K^2$ and temperature characteristics. For example, by using a $SrTiO_3$ (100) or $SrTiO_3$ (110) single crystal as the substrate, a 0° Y-cut, X-propagating $KNbO_3$ thin film having a $K^2$ of about 0.5 or a 90° Y-cut, X-propagating $KNbO_3$ thin film having a $K^2$ of about 0.1 may be produced, respectively.

However, since the $KNbO_3$ has a orthorhombic crystalline structure and exhibits $K^2$ anisotropy in the a, b, and c-axis directions, the $K^2$ of the $KNbO_3$ thin film decreases due to the mixture of the directions, even though the $KNbO_3$ is epitaxial. In order to solve this problem, Japanese Unexamined Patent Application Publication No. 11-116397 has disclosed a (020)-oriented perovskite potassium niobate thin film and a surface acoustic wave element including the thin film. In this disclosure, the (020)-oriented perovskite potassium niobate thin film is produced by applying an electric field for polarization that changes the orientation, and thus the piezoelectric characteristics thereof are enhanced.

However, the related art has certain problems s described below.

In Japanese Unexamined Patent Application Publication No. 11-116397, the polarization is performed in such a manner that the (020)-oriented perovskite potassium niobate thin film is subjected to application of a direct electric field to be polarized while being immersed in an insulative liquid, such as silicone oil, to prevent atmospheric discharge, and being heated to 150 to 200° C. After the thin-film is cooled with the electric field maintained, the electric field is removed. However, since the polarization process is performed separate from the manufacturing process of the surface acoustic wave element, it is expensive in time and effort. Also, the detailed technique for applying the direct electric field, including the structure of the electrodes for applying the direct electric field has not been disclosed.

In view of the foregoing disadvantages, one object of the present invention is to provide a method for making a potassium niobate thin film in which, in the process of manufacturing a surface acoustic wave element, a conductive thin film included in the surface acoustic wave element is used for polarization as an electrode for applying an electric field to the potassium niobate thin film that is to serve as the piezoelectric layer of the surface acoustic wave element. Another object of the invention includes providing a surface acoustic wave element, a frequency filter, a frequency oscillator, an electronic circuit, and an electronic apparatus.

SUMMARY

In order to solve the problems, the present invention is directed to a method for making a potassium niobate thin film subjected to polarization by applying an electric field thereto. The method comprises the step of depositing a conductive first thin film on the potassium niobate thin film. The first thin film functions as an interdigital electrode of a surface acoustic wave element when the potassium niobate thin film is used as a piezoelectric layer of the surface acoustic wave element. The first thin film is used as an electrode for applying the electric field to the potassium niobate thin film.

According to the method, polarization of the potassium niobate thin film can be performed in the same process for producing a surface acoustic wave element, but not separately because the first thin film is used as an upper electrode to apply an electric field. Also, since the thin film in contact with the potassium niobate thin film is used as an electrode, the polarization can be efficiently performed.

The method further comprises the step of depositing a conductive second thin film on the rear surface of the potassium niobate thin film. The second thin film is used as an electrode for applying the electric field to the potassium niobate thin film.

According to the method, polarization of the potassium niobate thin film can be performed in the same process for producing a surface acoustic wave element, and is not performed separately because the second thin film is also used as a lower electrode to apply an electric field. In addition, the first thin film may be used as the upper electrode. Also, since other thin films in contact with the potassium niobate thin film are used as electrodes, the polarization can be efficiently performed.

The present invention is also directed to a method for making a potassium niobate thin film subjected to polarization by applying an electric field thereto. The method comprises the step of depositing a conductive first thin film on the potassium niobate thin film. The first thin film functions as an interdigital electrode of a surface acoustic wave element when the potassium niobate thin film is used as a piezoelectric layer of the surface acoustic wave element. The method also includes the step of depositing a conductive third thin film on the rear surface of a crystal substrate of the surface acoustic wave element. The first thin film and the third thin film are used as electrodes for applying the electric field to the potassium niobate thin film.

According to the method, polarization of the potassium niobate thin film can be performed in the same process for producing a surface acoustic wave element, and is not separately because the first thin film and the third thin film are respectively used as an upper electrode and a lower electrode to apply an electric field. Also, since another thin film in contact with the potassium niobate thin film is used as an electrode, the polarization can be efficiently performed.

In the method for making a potassium niobate thin film, the potassium niobate thin film is heated to a temperature less than or equal to the phase transition temperature thereof between a tetragonal crystal phase and a orthorhombic crystal phase while the electric field is applied thereto.

According to this method, the orthorhombic structure of the potassium niobate thin film, which is the inherent crystal structure at room temperature, is not deformed by the heat treatment, and therefore, the directions of the crystal axes can be efficiently controlled by the electric field application.

A surface acoustic wave element of the present invention comprises a piezoelectric layer comprising a potassium niobate thin film, a conductive first thin film formed on the surface of the piezoelectric layer; and a conductive second thin film formed on the rear surface of the piezoelectric layer. The piezoelectric layer is subjected to electric field application to be polarized, using the first thin film and the second thin film as electrodes.

According to the method, polarization of the potassium niobate thin film can be performed in the same process for producing the surface acoustic wave element, but is not performed separately because the first thin film and the second thin film are respectively used as an upper electrode and a lower electrode to apply an electric field. Also, since other thin films in contact with the potassium niobate thin film are used as electrodes, the polarization can be efficiently performed.

The second thin film of the surface acoustic wave element may be a strontium ruthenate thin film.

According to this structure, the direction of crystal growth of the potassium niobate thin film can be adjusted in the early stages of the formation of the potassium niobate thin film and, thus, the resulting potassium niobate thin film can be highly oriented in a desired direction through the formation thereof, because the interval between strontium ruthenate crystal lattices is close to that of potassium niobate crystal lattices.

The surface acoustic wave element further comprises a strontium titanate substrate having the second thin film thereon.

According to this structure, the direction of crystal growth of the strontium ruthenate thin film can be adjusted in the early stages of the formation of the strontium ruthenate thin film and, thus, the resulting strontium ruthenate thin film can be highly oriented in a desired direction through the formation thereof, because the interval between strontium titanate crystal lattices is close to that of strontium ruthenate crystal lattices.

A surface acoustic wave element of the present invention comprises a piezoelectric layer comprising a potassium niobate thin film, a conductive first thin film formed on the surface of the piezoelectric layer, and a conductive third thin film formed on the rear surface of a crystal substrate underlying the piezoelectric layer. The piezoelectric layer is subjected to electric field application to be polarized, using the first thin film and the third thin film as electrodes.

According to the method, polarization of the potassium niobate thin film can be performed in the same process for producing the surface acoustic wave element, but is not performed separately because the first thin film and the third thin film are respectively used as an upper electrode and a lower electrode to apply an electric field. Also, since another thin film in contact with the potassium niobate thin film is used as an electrode, the polarization can be efficiently performed.

The first thin film of the surface acoustic wave element is formed as an interdigital electrode.

According to the method, polarization of the potassium niobate thin film can be efficiently performed in the same process for producing a surface acoustic wave element, but is not performed separately because the first thin film used as the upper electrode for applying an electric field is directly used as the layer in which an IDT electrode is formed. Also, since another thin film in contact with the potassium niobate thin film is used as an electrode, the polarization can be efficiently performed.

A frequency filter of the present invention comprises one of the above-described surface acoustic wave elements, a first electrode formed on the surface of the piezoelectric layer of the surface acoustic wave element, and a second electrode formed on the piezoelectric layer. The second electrode causes a specific frequency or frequencies in a specific band of surface acoustic waves generated in the piezoelectric layer by applying an electric signal to resonate, and converts the surface acoustic waves to an electric signal.

Since, the polarized potassium niobate thin film having excellent piezoelectric characteristics is used as the piezoelectric layer of the surface acoustic wave element in the above-described structure, an electric signal having a specific frequency or frequencies in a specific band can be efficiently filtered by efficiently applying a frequency electric signal to the first electrode. Thus, the miniaturization of frequency filters required for miniaturization of surface acoustic wave elements and a filter having broadband characteristics can be achieved.

A frequency oscillator of the present invention comprises one of the above-described surface acoustic wave elements, an electric signal application electrode formed on the piezoelectric layer of the surface acoustic wave element. The electric signal application electrode applies an electric signal to generate surface acoustic waves in the piezoelectric layer. A resonance electrode is also formed on the piezoelectric layer. The resonance electrode causes a specific frequency component or frequency components in a specific band of the surface acoustic waves to resonate. The surface acoustic waves are generated in the piezoelectric layer by the electric signal application electrode.

Since, the polarized potassium niobate thin film having excellent piezoelectric characteristics is used as the piezoelectric layer of the surface acoustic wave element in the above-described structure, surface acoustic waves can be generated by efficiently applying a frequency electric signal to the electric signal application electrode. Thus, the miniaturization of frequency oscillators required for miniaturization of surface acoustic wave elements and an oscillator having broadband characteristics can be achieved.

An electronic circuit of the present invention comprises the above-described frequency oscillator and an electric signal application element for applying the electric signal to the electric signal application electrode of the frequency oscillator. The electronic circuit selects a specific frequency component from the frequency components of the electric signal or converts the frequency components to a specific frequency component; or performs predetermined modulation and predetermined demodulation or predetermined detection on the electric signal.

According to the above-described structure, the electronic circuit has a miniaturized frequency oscillator having broadband characteristics, and it can efficiently perform various operations on frequency electric signals.

An electronic apparatus of the present invention comprises at least one of the group consisting of the above-described frequency filter, the above-described frequency oscillator, and the above-described electronic circuit.

According to the above-described structure, the electronic apparatus has at least one of a frequency filter, a frequency oscillator, and an electronic circuit that are miniaturized or have broadband characteristics. Accordingly, various electronic apparatuses that are miniaturized or have broadband characteristics can be provided, including a mobile communication apparatus and satellite broadcasting tuner.

DETAILED DESCRIPTION

A method for making a potassium niobate thin film of the present invention and a surface acoustic wave element, a frequency filter, a frequency oscillator, an electronic circuit, and an electronic apparatus using the potassium niobate thin film will now be described in detail with reference to drawings.

Figure 1:
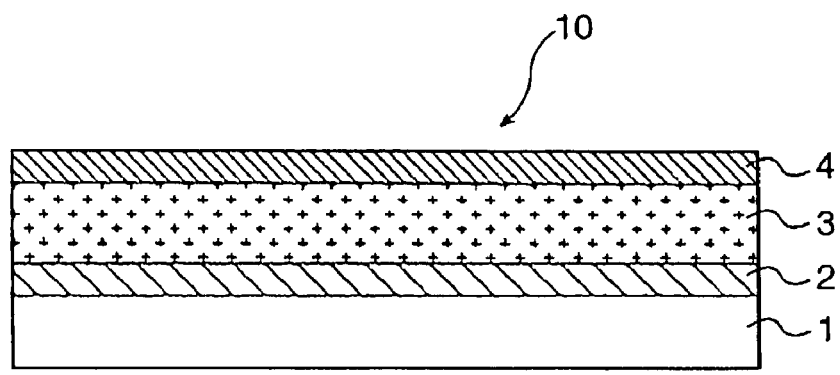
FIG. 1 is a sectional view of a step for forming thin layers for a surface acoustic wave element according to a first embodiment of the present invention.
Figure 2:
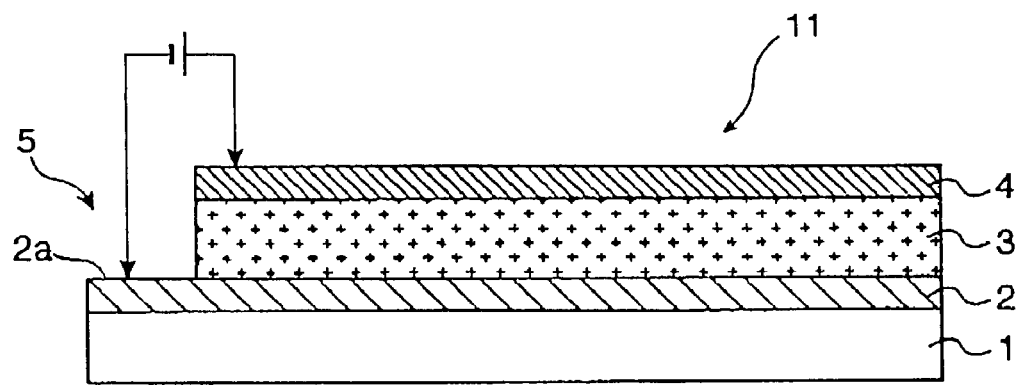
FIG. 2 is a sectional view of a step (when an electric field and heating are applied) for forming thin layers for the surface acoustic wave element according to the first embodiment of the present invention.

First Embodiment of a Potassium Niobate Thin Film Making Method and a Surface Acoustic Wave Element FIGS. 1 and 2 are sectional views of thin layers for a surface acoustic wave element according to a first embodiment of the present invention. As shown in FIG. 1, a lower electrode layer 2 of strontium ruthenate (hereinafter expressed as $SrRuO_3$) is deposited at a thickness of about 100 nm on a $SrTiO_3$ (110) single crystal substrate 1 at a substrate temperature of about 600° C. and an oxygen partial pressure of about 1.33 Pa by laser ablation using a $SrRuO_3$ target. However, the substrate temperature and the oxygen partial pressure are not limited to these values.

Next, a $KNbO_3$ piezoelectric layer 3 is deposited at a thickness of about 4 μm on the $SrRuO_3$ lower electrode layer 2 at a substrate temperature of about 600° C. and an oxygen partial pressure of about 1.33 Pa by laser ablation using a $KNbO_3$ target. However, the substrate temperature and the oxygen partial pressure are not limited to these values.

The resulting thin film 10 is an epitaxial film including $KNbO_3$, $SrRuO_3$, and $SrTiO_3$ respectively expressed by orthorhombic, pseudocubic, and cubic crystal indices as $KNbO_3$ (010)/$SrRuO_3$ (110)/$SrTiO_3$ (110) in the direction perpendicular to the surface thereof and as $KNbO_3$ <001>/$SrRuO_3$ <001>/$SrTiO_3$ <001> in the surface direction thereof.

The lattice constants of the $KNbO_3$ determined with a reciprocal lattice map by X-ray diffraction are a=0.568 nm, b=0.570 nm, and c=0.400 nm, wherein a, b, and c are lattice constants in the direction parallel to the substrate and the <-110> plane of the $SrTiO_3$ single crystal substrate, in the direction perpendicular to the substrate, and in the direction parallel to the substrate and the <001> plane of the $SrTiO_3$ single crystal substrate, respectively. These lattice constants suggest that the resulting $KNbO_3$ has small distortion in the orthorhombic crystal and exhibits irregular crystal axis directions relative to the orientation in comparison with a $KNbO_3$ single crystal whose lattice constants have been reported as a=0.5695 nm, b=0.5721 nm, and c=0.3973 nm.

Furthermore, a metallic, e.g., aluminum (hereinafter expressed as Al), upper electrode layer 4 is deposited at a thickness of about 100 nm on the $KNbO_3$ piezoelectric layer 3, as shown in FIG. 2, by vacuum deposition, and, for Al, under the conditions where the substrate temperature is about 25° C., the vacuum pressure is about 1.33×10³ Pa, and the atmospheric gas mixture ratio of argon to oxygen is 9:1. However, the substrate temperature and the atmospheric gas mixture ratio are not limited to these values. The Al upper electrode layer 4 corresponds to a first thin film of the present invention and the $SrRuO_3$ lower electrode layer 2 corresponds to a second thin film of the present invention.

Next, part of the $KNbO_3$ piezoelectric layer 3 and Al upper electrode layer 4 is etched to form an exposed portion 5 with a processing apparatus, not shown in the drawing, using an argon focusing ion beam as a processing source. In the exposed portion 5, a surface end 2a being part of $SrRuO_3$ lower electrode layer 2 is exposed and a direct voltage of 20 V is applied between the surface end 2a and the Al upper electrode layer 4 with a microprobe not shown in the drawing. At the same time, heat treatment is performed at a temperature of about 200° C. for about 1 hour with a heating mechanism not shown in the drawing. Preferably, the temperature of the heat treatment is between room temperature and about $T_t$, and more preferably about $0.4T_t$ to $0.9T_t$, wherein $T_t$ represents the phase transition temperature between a orthorhombic crystal phase and a tetragonal crystal phase (e.g., $T_t$=225° C.).

The resulting thin film 11 subjected to the electric field application and heat treatment is an epitaxial film including $KNbO_3$, $SrRuO_3$, and $SrTiO_3$ respectively expressed by orthorhombic, pseudocubic, and cubic crystal indices as $KNbO_3$ (010)/$SrRuO_3$ (110)/$SrTiO_3$ (110) in the direction perpendicular to the surface thereof and as $KNbO_3$ <001>/$SrRuO_3$ <001>/$SrTiO_3$ <001> in the surface direction thereof.

The lattice constants of the $KNbO_3$ determined with a reciprocal lattice map by X-ray diffraction are a=0.570 nm, b=0.572 nm, and c=0.397 nm, wherein a, b, and c are lattice constants in the direction parallel to the substrate and the <-110> plane of the $SrTiO_3$ single crystal substrate, in the direction perpendicular to the substrate, and in the direction parallel to the substrate and the <001> plane of the $SrTiO_3$ single crystal substrate, respectively. These lattice constants substantially agree with those of a $KNbO_3$ single crystal that have been reported as a=0.5695 nm, b=0.5721 nm, and c=0.3973 nm, thus suggesting that a $KNbO_3$ thin film in which the directions of the crystal axes are controlled is obtained.

Figure 3:
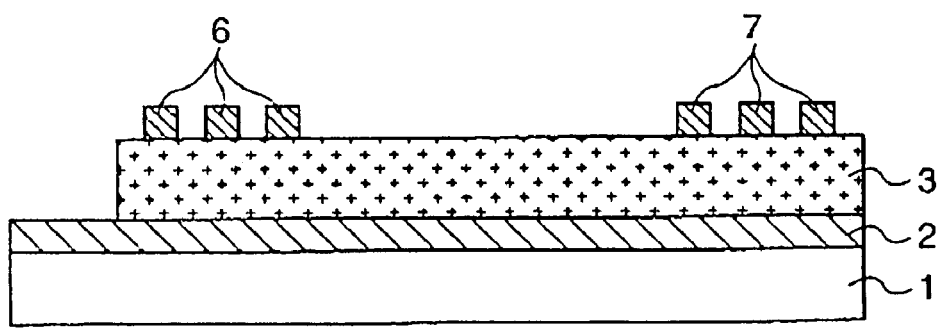
FIG. 3 is a sectional view of a surface acoustic wave element according to the first embodiment of the present invention.

FIG. 3 is a sectional view of a surface acoustic wave element of the first embodiment of the present invention. The Al upper electrode layer 4 of the thin film 11 after the electric field application and heat treatment is subjected to continuous processing including resist application, exposure, dry etching, and patterning by removing the resist. Thus IDT electrodes 6 and 7 are formed on the $KNbO_3$ piezoelectric layer 3.

The sound velocity of the resulting surface acoustic wave element is 4000 m/s, according to the result derived from the surface acoustic wave delay time $V_{open}$ between the IDT electrodes 6 and 7. The $K^2$ is 0.1, according to the result derived from the difference from the surface acoustic wave delay time $V_{short}$ when the IDT electrodes 6 and 7 are covered with a metallic thin film. In a surface acoustic wave element using a $KNbO_3$ piezoelectric layer not subjected to electric field application or heat treatment, while the sound velocity derived from the surface acoustic wave delay time $V_{open}$ between the IDT electrodes is 4000 m/s, the $K^2$ is 0.02. It is therefore shown that by applying an electric field and heat treatment to the $KNbO_3$ piezoelectric layer 3 to control the crystal axes, the $K^2$ is increased.

Even when the lower electrode is formed of a material selected from the group consisting of $CaRuO_3$, $BaRuO$, $SrMnO_3$, $CaMnO_3$, and $BaMnO_3$, instead of $SrRuO_3$, the same effects are obtained. Also, even when the piezoelectric layer is formed of the solid solution $K_{1-x}Na_xNb_{1-y}Ta_yO_3$ ($0<x\leq1$, $0<y<1$), instead of $KNbO_3$, the same effects are obtained.

According to the above-described structure, while the conductive Al thin film to be the IDT electrodes on the $KNbO_3$ thin film to be the piezoelectric layer serves as an upper electrode, the conductive $SrRuO_3$ thin film formed on the rear surface of the $KNbO_3$ thin film serves as a lower electrode. Since an electric field is applied to the $KNbO_3$ thin film through these upper and lower electrodes, polarization of the $KNbO_3$ thin film can be performed in the same process of producing a surface acoustic wave element, but is not performed separately. Moreover, since the thin films in contact with the $KNbO_3$ thin film are used as the electrodes, the polarization can be efficiently performed.

Figure 4:
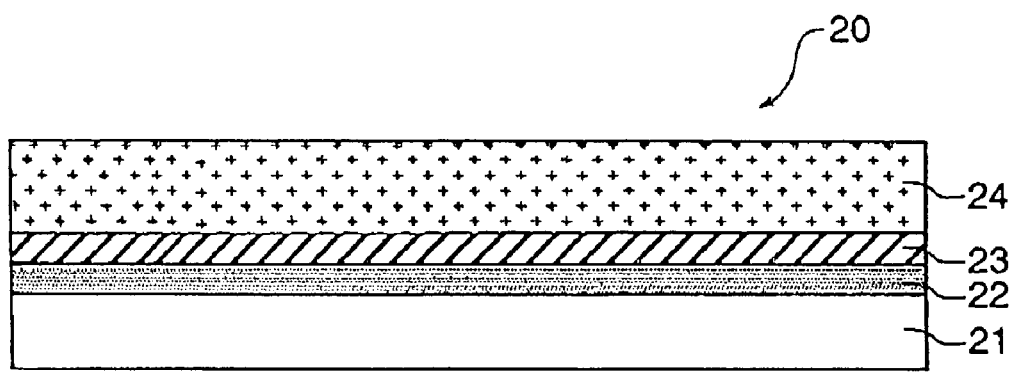
FIG. 4 is a sectional view of a step for forming thin layers for a surface acoustic wave element according to a second embodiment of the present invention.
Figure 5:
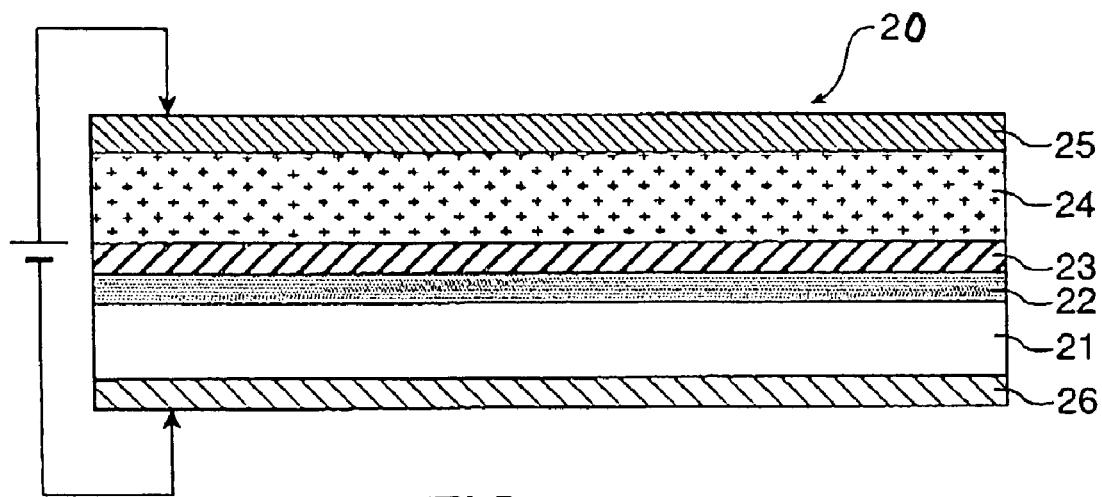
FIG. 5 is a sectional view of a step (when an electric field and heating are applied) for forming thin layers for the surface acoustic wave element according to the second embodiment of the present invention.

Second Embodiment of a Potassium Niobate Thin Film Making Method and a Surface Acoustic Wave Element FIGS. 4 and 5 are sectional views of thin layers for a surface acoustic wave element according to a second embodiment of the present invention. As shown in FIG. 4, a buffer layer 22 of yttria-stabilized zirconia (hereinafter expressed as YSZ) is deposited at a thickness of about 10 nm on a Si (100) substrate 21 at a substrate temperature of about 700° C. and an oxygen partial pressure of about 1.33×10⁻³ Pa by laser ablation using a YSZ target. However, the substrate temperature and the oxygen partial pressure are not limited to these values.

Next, $SrTiO_3$ dielectric layer 23 is deposited at a thickness of about 100 nm on the YSZ buffer layer 22 at a substrate temperature of about 600° C. and an oxygen partial pressure of about 1.33 Pa by laser ablation using a $SrTiO_3$ target. However, the substrate temperature and the oxygen partial pressure are not limited to these values.

Next, a $KNbO_3$ piezoelectric layer 24 is deposited at a thickness of about 4 μm on the $SrTiO_3$ dielectric layer 23 at a substrate temperature of about 600° C. and an oxygen partial pressure of about 1.33 Pa by laser ablation using a $KNbO_3$ target. However, the substrate temperature and the oxygen partial pressure are not limited to these values.

The resulting thin film 20 is an epitaxial film including $KNbO_3$, $SrTiO_3$, YSZ, and Si respectively expressed by orthorhombic, cubic, cubic, and cubic crystal indices as $KNbO_3$ (010)/$SrTiO_3$ (110)/YSZ (100)/Si (100) in the direction perpendicular to the surface thereof and as $KNbO_3$ <001>/$SrTiO_3$ <001>/YSZ <010>/Si <010> in the surface direction thereof.

The lattice constants of the $KNbO_3$ determined with a reciprocal lattice map by X-ray diffraction are a=0.568 nm, b=0.570 nm, and c=0.400 nm, wherein a, b, and c are lattice constants in the direction parallel to the substrate and the <-110> plane of the $SrTiO_3$ single crystal substrate, in the direction perpendicular to the substrate, and in the direction parallel to the substrate and the <001> plane of the $SrTiO_3$ single crystal substrate, respectively. These lattice constants suggest that the resulting $KNbO_3$ has small distortion in the orthorhombic crystal and exhibits irregular crystal axis directions relative to the orientation, in comparison with a KNbO$_3$ single crystal whose lattice constants have been reported as a=0.5695 nm, b=0.5721 nm, and c=0.3973 nm.

Furthermore, an Al upper electrode layer 25 and an Al lower electrode layer 26 are deposited at a thickness of about 100 nm on the KNbO$_3$ piezoelectric layer 24 and the rear surface of the Si substrate 21 respectively, by vacuum deposition of Al under the conditions where the substrate temperature is about 25° C., the vacuum pressure is about 1.33×10$^3$ Pa, and the atmospheric gas mixture ratio of argon to oxygen is 9:1, as shown in FIG. 5. However, the substrate temperature and the atmospheric gas mixture ratio are not limited to these values. The Al upper electrode layer 25 corresponds to a first thin film of the present invention and the Al lower electrode layer 26 corresponds to a third thin film of the present invention.

Next, a direct voltage of 20 V is applied between the Al upper electrode layer 25 and the Al lower electrode layer 26 with a microprobe not shown in the drawing while heat treatment is performed at a temperature of about 200° C. for about 1 hour with a heating mechanism not shown in the drawing. Preferably, the temperature of the heat treatment is between room temperature and about $T_t$, and more preferably about $0.4T_t$ to $0.9T_t$, wherein $T_t$ represents phase transition temperature between a orthorhombic crystal phase and a tetragonal crystal phase (e.g., $T_t$=225° C.).

The resulting thin film 20 after the electric field application and the heat treatment is an epitaxial film including KNbO$_3$, SrTiO$_3$, YSZ, and Si respectively expressed by orthorhombic, cubic, cubic, and cubic crystal indices as KNbO$_3$ (010)/SrTiO$_3$ (110)/YSZ (100)/Si (100) in the direction perpendicular to the surface thereof and as KNbO$_3$ <001>/SrTiO$_3$ <001>/YSZ <010>/Si <010> in the surface direction thereof.

The lattice constants of the KNbO$_3$ determined with a reciprocal lattice map by X-ray diffraction are a=0.570 nm, b=0.572 nm, and c=0.397 nm, wherein a, b, and c are lattice constants in the direction parallel to the substrate and the <–110> plane of the SrTiO$_3$ single crystal substrate, in the direction perpendicular to the substrate, and in the direction parallel to the substrate and the <001> plane of the SrTiO$_3$ single crystal substrate, respectively. These lattice constants substantially agree with those of a KNbO$_3$ single crystal that have been reported as a=0.5695 nm, b=0.5721 nm, and c=0.3973 nm, thus suggesting that a KNbO$_3$ thin film in which the directions of the crystal axes are controlled is obtained.

Figure 6:
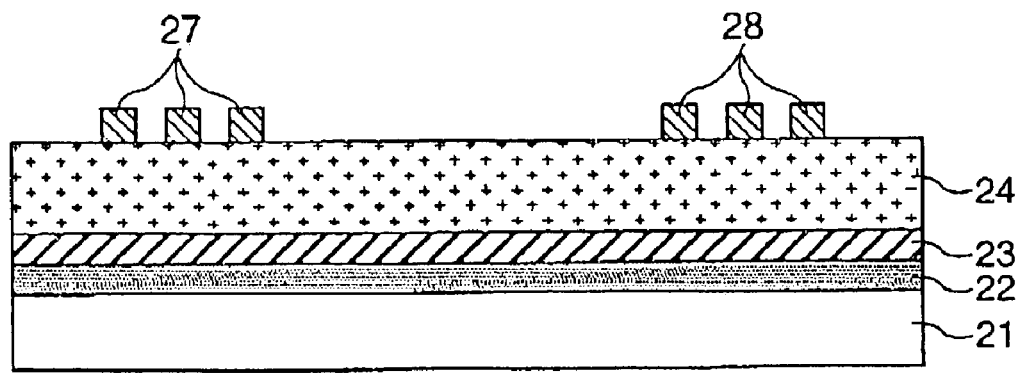
FIG. 6 is a sectional view of the surface acoustic wave element according to the second embodiment of the present invention.

FIG. 6 is a sectional view of a surface acoustic wave element according to the second embodiment of the present invention. The Al upper electrode layer 25 of the thin film 20 after the electric field application and the heat treatment is subjected to continuous processing including resist application, exposure, dry etching, and patterning by removing the resist. Thus IDT electrodes 27 and 28 are formed on the KNbO$_3$ piezoelectric layer 24.

The sound velocity of the resulting surface acoustic wave element is 4000 m/s, according to the result derived from the surface acoustic wave delay time $V_{open}$ between the IDT electrodes 27 and 28. The $K^2$ is 0.1, according to the result derived from the difference from the surface acoustic wave delay time $V_{short}$ when the IDT electrodes 27 and 28 are covered with a metallic thin film. In a surface acoustic wave element using a KNbO$_3$ piezoelectric layer not subjected to electric field application or heat treatment, while the sound velocity derived from the surface acoustic wave delay time $V_{open}$ between the IDT electrodes is 4000 m/s, the $K^2$ is 0.02. It is therefore shown that by applying an electric field and heat treatment to the KNbO$_3$ piezoelectric layer 3 to control the crystal axes, the $K^2$ is increased.

Also, even when the piezoelectric layer is formed of the solid solution K$_{1-x}$Na$_x$Nb$_{1-y}$Ta$_y$O$_3$ (0<x≦1, 0<y<1), instead of KNbO$_3$, the same effects are obtained.

According to the above-described structure, while the conductive Al thin film to be the IDT electrodes on the KNbO$_3$ thin film to be the piezoelectric layer serves as an upper electrode, the conductive Al thin film formed on the rear surface of the Si substrate 21 serves as a lower electrode. Since an electric field is applied to the KNbO$_3$ thin film through these upper and lower electrodes, polarization of the KNbO$_3$ thin film can be performed in the same process of producing a surface acoustic wave element, but is not performed separately. Moreover, since the thin films close to the KNbO$_3$ thin film are used as electrodes, the polarization can be efficiently performed.

Frequency Filter

Figure 7:
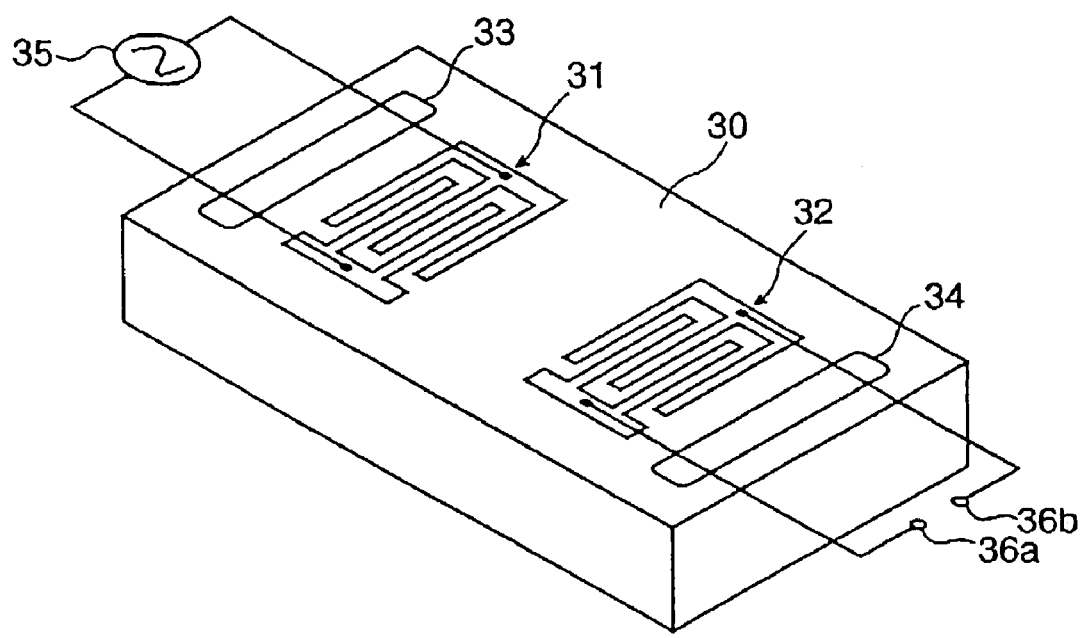
FIG. 7 is a perspective view showing the external appearance of a frequency filter according to an embodiment of the present invention.

FIG. 7 is a perspective view showing the external appearance of a frequency filter according to an embodiment of the present invention. The frequency filter shown in FIG. 7 has a substrate 30. The substrate 30 may include the SrRuO$_3$ lower electrode layer 2 and the KNbO$_3$ piezoelectric layer 3 deposited on the SrTiO$_3$ (110) single crystal substrate 1 in that order, shown in FIG. 3, or include the YSZ buffer layer 22, the SrTiO$_3$ dielectric layer 23, and the KNbO$_3$ piezoelectric layer 24 deposited on the Si (100) substrate 21 in that order, shown in FIG. 6.

On the upper surface of the substrate 30, IDT electrodes 31 and 32 are formed. The IDT electrodes 31 and 32 are formed of, for example, Al or an Al alloy to a thickness of about one hundredth of the pitch between the IDT electrodes 31 and 32. Also, sound absorbers 33 and 34 are formed with the IDT electrodes 31 and 32 therebetween, on the upper surface of the substrate 30. The sound absorbers 33 and 34 are intended to absorb surface acoustic waves propagating on the surface of the substrate 30. The IDT electrode 31 on the substrate 30 is connected to a high-frequency signal source 35 and the IDT electrode 32 is connected to signal lines. The IDT electrode 31 corresponds to a first electrode of the present invention and the IDT electrode 32 corresponds to a second electrode of the present invention.

When a high-frequency signal is output from the high-frequency signal source 35 in the above-described structure, the high-frequency signal is applied to the IDT electrode 31 to generate surface acoustic waves on the upper surface of the substrate 30. The surface acoustic waves propagate at a speed of about 4000 m/s on the upper surface of the substrate 30. The surface acoustic waves propagated from the IDT electrode 31 to the sound absorber 33 are absorbed by the sound absorber 33. On the other hand, the surface acoustic waves propagated to the IDT electrode 32 and having a specific frequency or frequencies in a specific band set according to the pitch of the IDT electrode 32 or the like are converted to an electric signal to be transmitted to terminals 36a and 36b through the signal lines. Most of the frequency components other than the specific frequency or frequencies in the specific band pass through the IDT electrode 32 to be absorbed by the sound absorber 34.

Thus, only the surface acoustic waves having a specific frequency or frequencies in a specific band can be obtained (filtered) from the electric signals supplied to the IDT electrode 31 included in the frequency filter of the embodiment.

Frequency Oscillator

Figure 8:
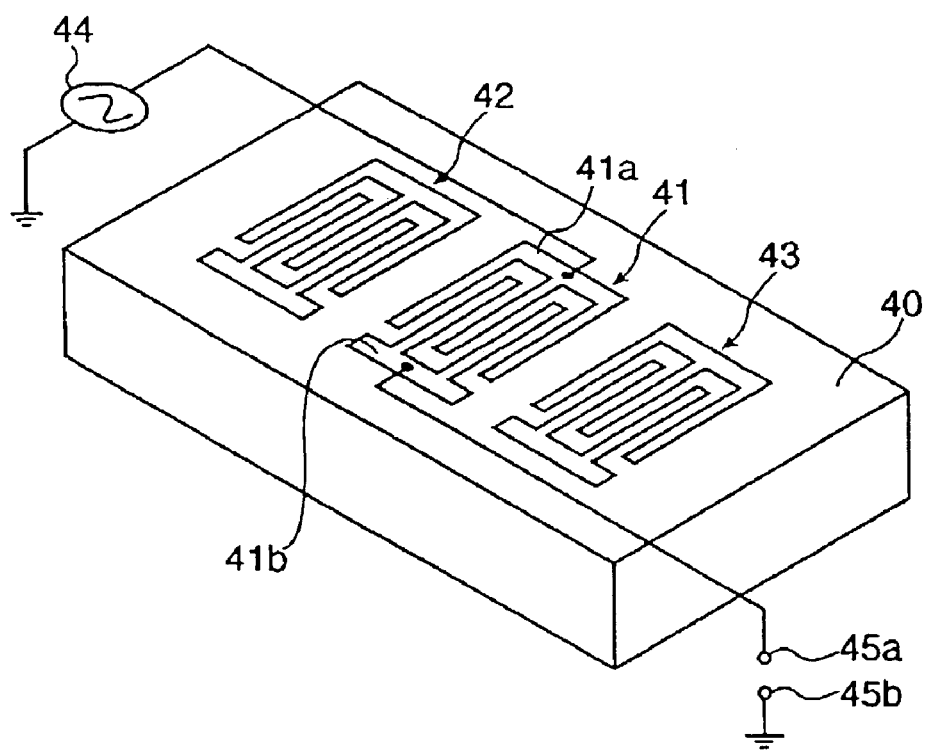
FIG. 8 is a perspective view showing the external appearance of a frequency oscillator according to an embodiment of the present invention.

FIG. 8 is a perspective view showing the external appearance of a frequency oscillator according to an embodiment of the present invention. The frequency oscillator shown in FIG. 8 has a substrate 40. The substrate 40 may include the SrRuO$_3$ lower electrode layer 2 and the KNbO$_3$ piezoelectric layer 3 deposited on the SrTiO$_3$ (110) single crystal substrate 1 in that order, shown in FIG. 3, or include the YSZ buffer layer 22, the SrTiO$_3$ dielectric layer 23, and the KNbO$_3$ piezoelectric layer 24 deposited on the Si (100) substrate 21 in that order, shown in FIG. 6.

On the upper surface of the substrate 40, an IDT electrode 41 is formed and further IDT electrodes 42 and 43 are formed with the IDT electrode 41 therebetween. The IDT electrodes 41 to 43 are formed of, for example, Al or an Al alloy to a thickness of about one hundredth of the pitch between the IDT electrodes 41 to 43. The IDT electrode 41 includes a pair of comb-shaped electrodes 41a and 41b respectively connected to a high-frequency signal source 44 and a signal line. The IDT electrode 41 corresponds to an electric signal application electrode of the present invention, and the IDT electrodes 42 and 43 correspond to resonance electrodes of the present invention for causing a specific frequency component or components in a specific band of surface acoustic waves generated by the IDT electrode 41 to resonate.

When a high-frequency signal is output from the high-frequency signal source 44 in the above-described structure, the high-frequency signal is applied to the comb-shaped electrode 41a of the IDT electrode 41 to generate surface acoustic waves propagating to the IDT electrode 42 and IDT electrode 43 on the upper surface of the substrate 40. The speed of the surface acoustic waves is about 4000 m/s. Some surface acoustic waves of the generated surface acoustic waves, having a specific frequency component are reflected at the IDT electrodes 42 or 43 and thus standing waves are generated between the IDT electrodes 42 and 43. By repeating the reflection of the surface acoustic waves having the specific frequency component between the IDT electrodes 42 and 43, a specific frequency component or components in a specific band resonate to increase the amplitude. Some of the surface acoustic waves having the specific frequency component or frequency components in the specific band are transmitted to the other comb-shaped electrode 41b of the IDT electrode 41, and thus an electric signal having a frequency (or frequencies in a band) according to the resonance frequency between the IDT electrodes 42 and 43 are drawn out of terminals 45a and 45b.

FIGS. 9(a) and (b) shows a VCSO (voltage controlled SAW oscillator) using a surface acoustic wave element according to an embodiment of the present invention, and FIG. 9(a) is a cut-away view from a side and FIG. 9(b) is a cut-away view from above. The VCSO is contained in a metallic (e.g., aluminum or stainless steel) case 50. Reference numeral 51 designates a substrate on which an IC (integrated circuit) 52 and a frequency oscillator 53 are mounted. The IC 52 is intended to control the frequency applied to the frequency oscillator 53 according to the voltage input from an external circuit not shown in the drawing.

The frequency oscillator 53 includes IDT electrodes 55a to 55c on a substrate 54, having substantially the same structure as in the frequency oscillator shown in FIG. 8. The substrate 54 may include the SrRuO$_3$ lower electrode layer 2 and the KNbO$_3$ piezoelectric layer 3 deposited on the SrTiO$_3$ (110) single crystal substrate 1 in that order, shown in FIG. 3, or include the YSZ buffer layer 22, the SrTiO$_3$ dielectric layer 23, and the KNbO$_3$ piezoelectric layer 24 deposited on the Si (100) substrate 21 in that order, shown in FIG. 6.

Also, a wire 56 for connecting the IC 52 and the frequency oscillator 53 is formed on the substrate 51 by patterning. The IC 52 and the wire 56 are connected to each other with a wire 57 formed of gold or the like, and the frequency oscillator 53 and the wire 56 are connected to each other with a wire 58 formed of gold or the like. Thus, the IC 52 and the frequency oscillator 53 are electrically connected to each other through the wire 56.

Figure 9:
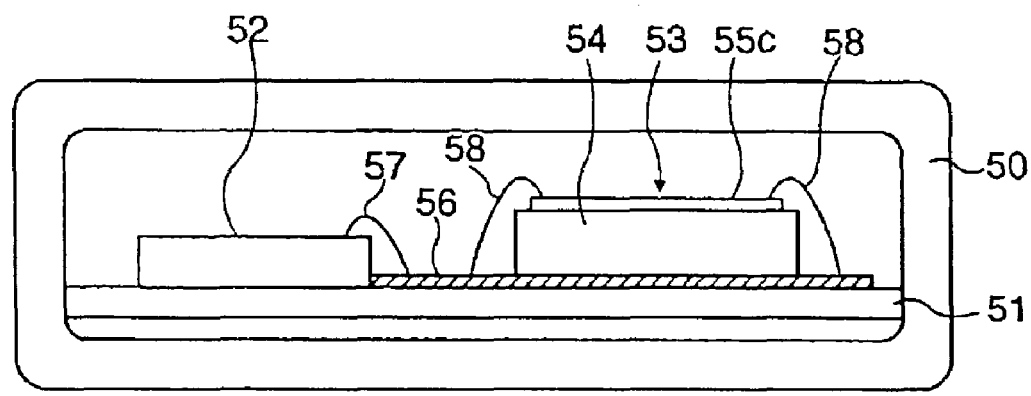
FIGS. 9(a) and (b) show a VCSO (voltage controlled SAW oscillator) using a surface acoustic wave element according to an embodiment of the present invention, FIG. 9(a) being a cut-away view from a side, (b) being a cut-away view from above.
Figure 9:
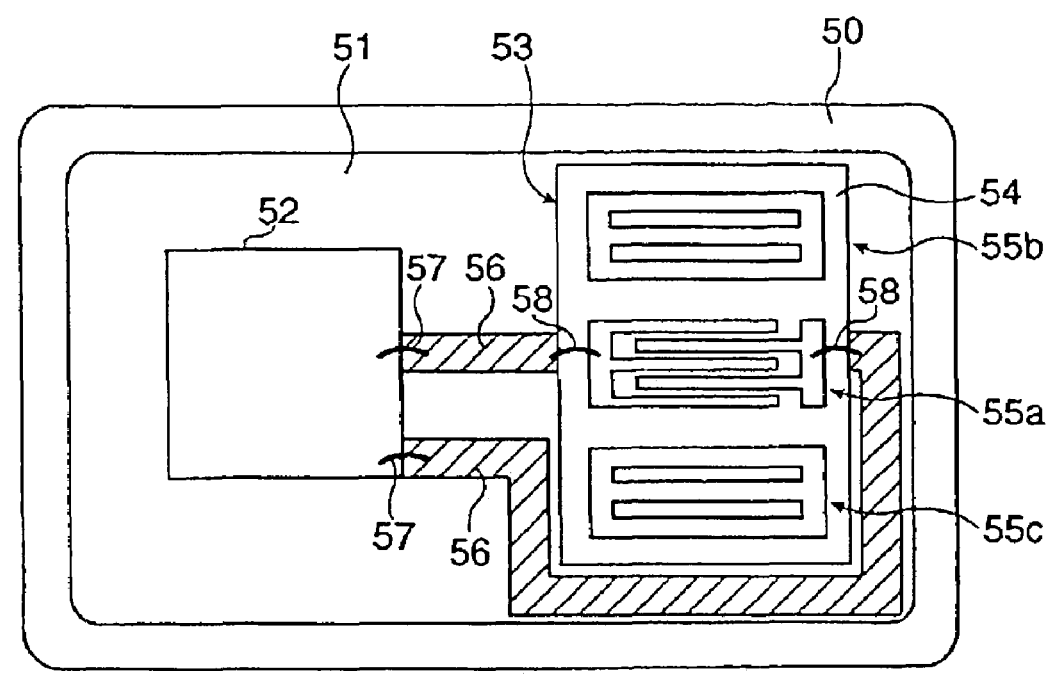
Figure 10:
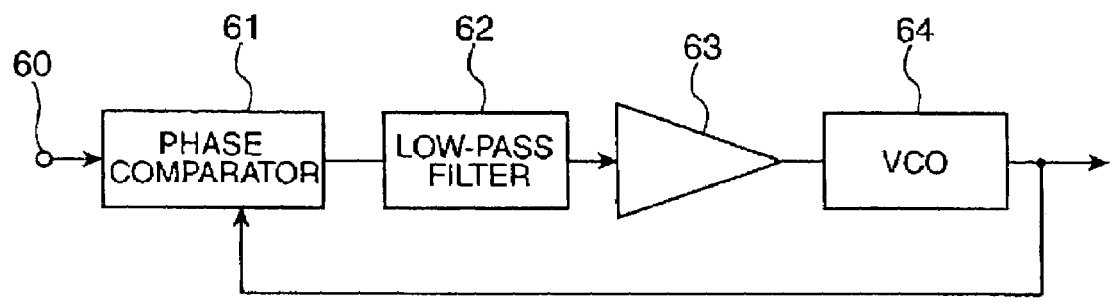
FIG. 10 is a block diagram showing the fundamental structure of a PLL circuit.

The VCSO shown in FIG. 9 is used as, for example, the VCO (voltage controlled oscillator) of a PLL circuit shown in FIG. 10. The PLL circuit will now be described. FIG. 10 is a block diagram showing the fundamental structure of a PLL circuit. The PLL circuit includes a phase comparator 61, a low-pass filter 62, an amplifier 63, and a VCO 64, as shown in FIG. 10.

The phase comparator 61 compares the phase (or frequency) of the signal input from an input terminal 60 with the phase (or frequency) of the signal output from the VCO 64, and outputs an error voltage signal set according to the difference between the phases (or frequencies). The low-pass filter 62 transmits only low-frequency components of the position of the error voltage signal output from the phase comparator 61, and the amplifier 63 amplifies the signal output from the low-pass filter 62. The VCO 64 is an oscillation circuit in which the oscillation frequency is continuously changed in a range according to the voltage input thereto. The PLL circuit is operated so as to reduce the difference with respect to the phase (or frequency) input from the input terminal 60, thus synchronizing the frequency of the signal output from the VCO 64 with the frequency of the signal input from the input terminal 60. After the frequency of the signal output from the VCO 64 is synchronized with the frequency of the signal input from the input terminal 60, a signal is output that corresponds to the signal input from the input terminal 60 with a certain phase difference eliminated and that follows changes of input signals.

Electronic Circuit

Figure 11:
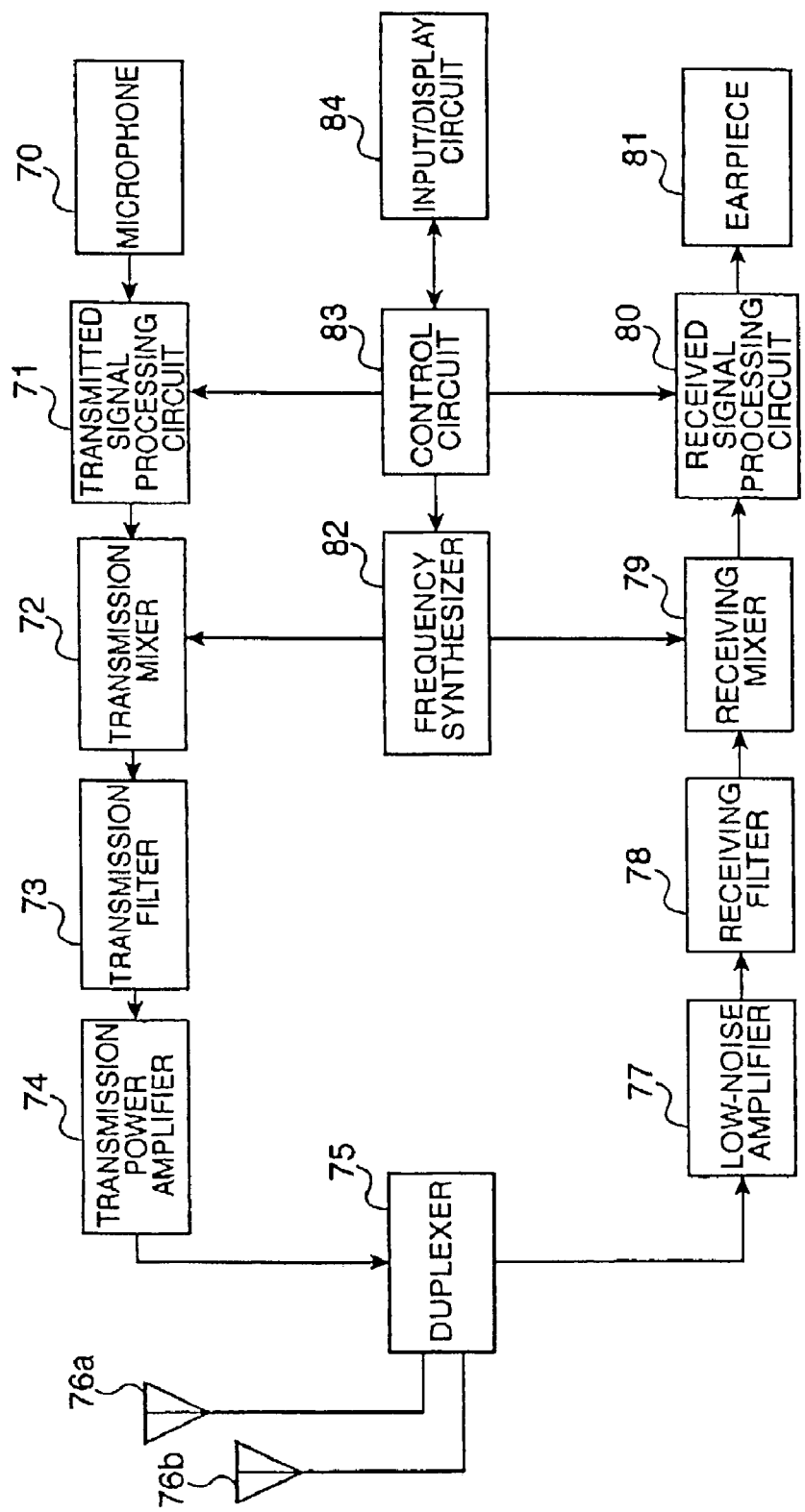
FIG. 11 is a block diagram showing the structure of an electronic circuit according to an embodiment of the present invention.
Figure 12:
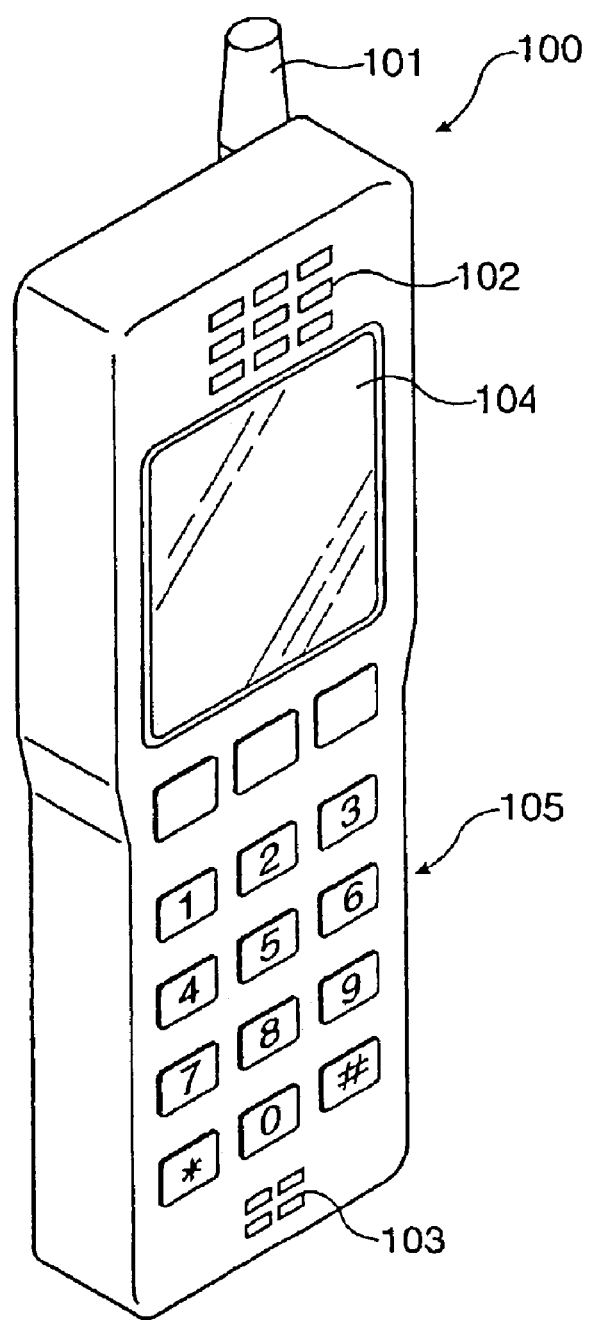
FIG. 12 is a perspective view showing the external appearance of a cellular phone as an electronic apparatus according to an embodiment of the present invention.

FIG. 11 is a block diagram showing the electrical structure of an electronic circuit according to an embodiment of the present invention. The electronic circuit shown in FIG. 11 may be contained in a cellular phone 100 shown in FIG. 12. FIG. 12 is a perspective view showing the external appearance of the cellular phone as an electronic apparatus according to an embodiment of the present invention. The cellular phone 100 shown in FIG. 12 includes an antenna 101, an earpiece 102, a microphone 103, a liquid crystal display 104, and operation buttons 105.

FIG. 11 shows the fundamental structure of the electronic circuit in the cellular phone 100, and the electronic circuit includes a microphone 70, a transmitted signal processing circuit 71, a transmission mixer 72, a transmission filter 73, a transmission power amplifier 74, a duplexer 75, antennas 76a and 76b, a low-noise amplifier 77, a receiving filter 78, a receiving mixer 79, a received signal processing circuit 80, an earpiece 81, a frequency synthesizer 82, a control circuit 83, and an input/display circuit 84. Currently-used cellular phones however have more complicated structures because frequency conversion is performed several times therein.

The microphone 70 may be a microphone converting sound signals to radio signals and corresponds to the microphone 103 shown in FIG. 12. The transmitted signal processing circuit 71 performs, for example, D/A conversion, modulation, and the like on the electric signals output from the microphone 70. The transmission mixer 72 mixes the signal output from the transmitted signal processing circuit 71 with a signal output from the frequency synthesizer 82.

The frequency of the signal supplied to the transmission mixer 72 is, for example, 380 MHz. The transmission filter 73 transmits only a signal having a necessary intermediate frequency (IF) and blocks signals having unnecessary frequencies. The signal output from the transmission filter 73 is converted to an RF signal by a converter circuit not shown in the drawing. The frequency of the RF signal is, for example, 1.9 GHz. The transmission power amplifier 74 amplifies the power of the RF signal from the transmission filter 72 and outputs the power to the duplexer 75.

The duplexer 75 sends the RF signal output from the transmission power amplifier 74 in a radio wave form, from the antennas 76a and 76b. The duplexer 75 also splits the signal received by the antennas 76a and 76b and outputs the split signal to the low-noise amplifier 77. The frequency of the received signal output from the duplexer 75 is, for example, 2.1 GHz. The low-noise amplifier 77 amplifies the received signal from the duplexer 75. The signal output from the low-noise amplifier 77 is converted to an intermediate frequency (IF) signal by a converter circuit not shown in the drawing.

The receiving filter 78 transmits only a signal having a necessary intermediate frequency (IF) of intermediate frequency signals converted by the converter circuit not shown in the drawing and blocks signals having unnecessary frequencies. The receiving mixer 79 mixes the signal output from the receiving filter 78 with a signal output from the frequency synthesizer 82. The intermediate frequency supplied to the receiving mixer 79 is, for example, 190 MHz. The received signal processing circuit 80 performs, for example, A/D conversion, demodulation, and the like on the signal output from the receiving mixer 79. The earpiece 81 may be a small loudspeaker for converting electric signals to sound signals and corresponds to the earpiece 102 shown in FIG. 12.

The frequency synthesizer 82 is a circuit for generating a signal (for example, having a frequency of about 380 MHz) supplied to the transmission mixer 72 and a signal (for example, having a frequency of about 190 MHz) supplied to the receiving mixer 79. The frequency synthesizer 82 may include a PLL circuit sending a signal at an oscillation frequency of 760 MHz, divides the signal output from the PLL circuit to generate a signal having a frequency of 380 MHz, and further divides the signal to generate a signal having a frequency of 190 MHz. The control circuit 83 controls the transmitted signal processing circuit 71, the received signal processing circuit 80, the frequency synthesizer 82, and the input/display circuit 84 to control the entire operation of the cellular phone. The input/display circuit 84 displays the state of the apparatus for the user of the cellular phone 100 and allows the user to input directions, and may correspond to the liquid crystal display 104 and the operation buttons 105 shown in FIG. 12.

In the electronic circuit having the above-described structure, the frequency filter shown in FIG. 7 is used as the transmission filter 73 and the receiving filter 78. The frequencies subjected to filtering (or transmitted) are separately set in the transmission filter 73 and the receiving filter 78 according to a necessary frequency in the signal output from the transmission mixer 72 and a necessary frequency in the signal output from the receiving mixer 79, respectively. The PLL circuit in the frequency synthesizer 82 includes the frequency oscillator shown in FIG. 8 or the frequency oscillator (VCSO) shown in FIG. 9 used as the VCO 64 in the PLL circuit shown in FIG. 10.

While the present invention has been described using the surface acoustic wave element, frequency filter, frequency oscillator, electronic circuit, and electronic apparatus according to the embodiments thereof, it is not limited to the forms of the above-described embodiments and various modifications may be made within the scope of the invention. For example, the embodiments illustrate the electronic apparatus, and the electronic circuit respectively using the cellular phone and the electronic circuit in the cellular phone as their examples. However, the present invention is not limited to use for cellular phones, but may be used for various mobile communication apparatuses and electronic circuits in the mobile communication apparatuses.

Also, the present invention may be applied to stationary communication apparatus, such as a tuner for receiving broadcast of BS (broadcast satellite) and CS (commercial satellite), as well as mobile communication apparatuses, and to electronic circuits contained in stationary apparatuses. Furthermore, the present invention may be applied to not only communication apparatuses using radio waves propagated in the air as a communication carrier but also electronic apparatuses using high-frequency signals propagated in a coaxial cable or optical signals propagated in an optical cable, such as a HUB, and to electronic circuits contained in such apparatuses.

ADVANTAGES

As described above, according to the invention, when a $KNbO_3$ thin film to function as a piezoelectric layer is subjected to polarization to adjust the directions of the crystal axes thereof and enhance the piezoelectric characteristics thereof, a conductive Al thin film to be an IDT electrode on the $KNbO_3$ thin film serves as an upper electrode, and a conductive $SrRuO_3$ thin film on the rear surface of the $KNbO_3$ thin film serves as a lower electrode. Since an electric field is applied to the $KNbO_3$ through these upper and lower electrodes, polarization of the $KNbO_3$ thin film can be performed in the same process of producing a surface acoustic wave element, but is not performed separately. Also, since the thin films in contact with or close to the $KNbO_3$ are used as electrodes, the polarization can be efficiently performed.

The entire disclosure of Japanese Patent Application No.2002-089821 filed Mar. 27, 2002 is incorporated by reference.

What is claimed is:

1. A method for making a potassium niobate film comprising:
   depositing a potassium niobate film above a substrate;
   depositing a first conductive film on the potassium niobate film;
   applying an electric field to the potassium niobate film; and
   after the step of applying the electric field to the potassium niobate film, forming IDT electrodes by patterning the first conductive film;
   wherein, before the potassium niobate film is deposited above the substrate, a second conductive film is deposited above the substrate.

2. The method for making a potassium niobate film according to claim 1, wherein the electric field is applied by using the first conductive film.

3. The method for making a potassium niobate film according to claim 1, wherein the electric field is applied by using the second conductive film.

4. The method for making a potassium niobate film according to claim 1, wherein the potassium niobate film is heated at a temperature less than or equal to a phase transition temperature thereof between a tetragonal crystal phase and a orthorhombic crystal phase while the electric field is applied thereto.

5. A method for making a potassium niobate film comprising:
- depositing a potassium niobate film above a substrate;
- depositing a first conductive film on the potassium niobate film;
- depositing a second conductive film under the substrate;
- applying an electric field to the potassium niobate film; and
- after the step of applying the electric field to the potassium niobate film, forming IDT electrodes by patterning the first conductive film.

6. The method for making a potassium niobate film according to claim 5, wherein the electric field is applied by using the first conductive film and the second conductive film.

7. The method for making a potassium niobate film according to claim 5, wherein the potassium niobate film is heated at a temperature less than or equal to a phase transition temperature thereof between a tetragonal crystal phase and a orthorhombic crystal phase while the electric field is applied thereto.

8. A method for manufacturing a surface acoustic wave device comprising the method for making a potassium niobate film according to claim 1.

9. A method for manufacturing a frequency filter comprising the method for making a potassium niobate film according to claim 1.

10. A method for manufacturing an electronic device comprising the method for making a potassium niobate film according to claim 1.

11. A method for manufacturing a surface acoustic wave device comprising the method for making a potassium niobate film according to claim 5.

12. A method for manufacturing a frequency filter comprising the method for making a potassium niobate film according to claim 5.

13. A method for manufacturing an electronic device comprising the method for making a potassium niobate film according to claim 5.

14. The method for making a potassium niobate film according to claim 1, further comprising forming an exposed portion by etching a part of the potassium niobate film and a part of the first conductive film.

* * * * *